(12) United States Patent
Dong

(10) Patent No.: US 7,215,227 B2
(45) Date of Patent: May 8, 2007

(54) GM-C FILTER COMPENSATION

(75) Inventor: Zhiwei Dong, Ausitn, TX (US)

(73) Assignee: Silicon Laboratories Inc., Austin, TX (US)

( * ) Notice: Subject to any disclaimer, the term of this patent is extended or adjusted under 35 U.S.C. 154(b) by 78 days.

(21) Appl. No.: 10/814,447

(22) Filed: Mar. 31, 2004

(65) Prior Publication Data

US 2005/0219014 A1  Oct. 6, 2005

(51) Int. Cl.
*H03H 11/00* (2006.01)
(52) U.S. Cl. .................. 333/214; 333/215; 333/216
(58) Field of Classification Search .............. 333/214
See application file for complete search history.

(56) References Cited

U.S. PATENT DOCUMENTS

| | | | | |
|---|---|---|---|---|
| 5,635,884 A | 6/1997 | Fujii | ............ | 333/215 |
| 5,793,251 A | 8/1998 | Fujii | ............ | 329/337 |
| 5,825,265 A | 10/1998 | Fujii | ............ | 333/215 |
| 6,028,496 A * | 2/2000 | Ko et al. | ............ | 333/214 |
| 6,317,016 B1 | 11/2001 | Kuo | ............ | 333/215 |
| 6,545,534 B1 * | 4/2003 | Mehr | ............ | 330/69 |
| 6,574,288 B1 | 6/2003 | Welland et al. | ............ | 375/327 |
| 6,778,023 B2 * | 8/2004 | Christensen | ............ | 331/16 |
| 6,823,292 B2 * | 11/2004 | Spencer | ............ | 702/190 |

* cited by examiner

*Primary Examiner*—Robert Pascal
*Assistant Examiner*—Kimberly E Glenn
(74) *Attorney, Agent, or Firm*—Trop, Pruner & Hu, P.C

(57) ABSTRACT

Compensation of effects derived from bandwidth limitations of an active frequency-selective circuit is effected by appropriately coupling a resistance to the frequency-selective circuit. In one embodiment, the resistance is designed to have a value that is inversely related to the tangent of a phase-shift at a compensation frequency.

31 Claims, 5 Drawing Sheets

GM-C FILTER COMPENSATION

FIELD OF THE INVENTION

The invention relates generally to the design of active filter circuits and, more particularly, to a technique to effect compensation of the finite bandwidth of an operational transconductance amplifier (OTA) that is used in the implementation of a Gm-C (transconductance/capacitance) filter, for example.

BACKGROUND

Operational transconductance amplifiers (OTAs) are commonly used to realize certain passive components, e.g., inductors, in integrated circuit devices. In one implementation, cross-coupled OTAs are configured to constitute a gyrator. As a result of gyrator operation, a capacitance coupled across an output port of the gyrator is reflected as an inductance across the gyrator input port. The magnitude of the reflected inductance is proportional to the capacitance of the capacitor and is inversely proportional to the square of the transconductance of the OTAs that constitute the gyrator. In general, this technique is effective to instantiate components, such as inductors, that are not easily implemented through conventional integrated circuit fabrication techniques. Additionally, OTA implementation enables frequency-selective passive components (e.g., integrated inductors) to be electronically tuned by controlling the transconductance of the gyrator OTAs However, the finite bandwidth of the gyrator OTAs is manifest as a transconductance that is a function of the frequency of operation. That is, the OTA transconductance (Gm) is bandwidth limited in a manner that is defined by the cutoff frequency of the OTA. Consequently, when the gyrator-synthesized inductance is incorporated into a filter circuit, the frequency-dependent transconductance of the gyrator causes spurious peaks in the filter passband, and causes degradation in the stopband attenuation. Conventional approaches to the remediation of these anomalies have been predominately directed to increasing the bandwidth of the gyrator OTAs. However, only limited success is achievable in this manner, in large part because OTAs with the requisite bandwidth are difficult to design and implement. Consider, for example, an active bandpass filter designed to have a cutoff frequency at 80 MHz. Simulation results suggest that in order to suppress passband peaks in the transfer function of such an OTA-implemented filter to less than 0.2 db, for example, an OTA bandwidth of 8 GHz may be required. That is to say, in such applications the OTA bandwidth is preferably at least 100 times the filter cutoff frequency. Attempts to extend the bandwidth of the OTAs to such a frequency may be confronted by the limitations of state-of-the-art semiconductor device fabrication techniques. In addition, extremely high bandwidth may sometimes be had only at the risk of instability.

Accordingly, what is desired is a technique that mitigates anomalies in the frequency-dependent characteristics of integrated circuit components that are predicated on finite-bandwidth OTAs. In particular, it is desired that there be provided a technique to minimize spurious peaks, or ripples, in the passband of Gm-C filters.

SUMMARY OF THE INVENTION

In accordance with an embodiment, it has been determined that the performance of an active filter, such as a Gm-C filter, may be compromised by bandwidth limitations associated with practicably realizable OTAs. In particular, the finite bandwidths of the OTAs that are incorporated into a Gm-C filter have been found to give rise to peaks, or ripples, in the passband of the Gm-C filter. A customary approach to remediation of this undesired effect is to attempt to extend the bandwidth of the OTA. However, it has proven difficult to design and reliably fabricate OTAs having a bandwidth that adequately suppresses passband peaks, particularly when the target filter must exhibit a passband cutoff approaching 100 MHz.

Accordingly, in one embodiment, a frequency-selective circuit comprises an active device with a limited bandwidth that is defined by a cutoff frequency. A reactive component is coupled to the output of the active device and a compensation resistance is coupled to the reactive device. The compensation resistance is effective to compensate for a bandwidth limitation of the active device.

In another embodiment, a frequency-selective circuit comprises an OTA circuit having a bandwidth-limited transconductance that is defined by a cut-off frequency. A capacitor is coupled to an output of the OTA circuit so as to reflect an inductor at an input of the OTA circuit. A compensation resistor coupled to the capacitor is effective to compensate for a bandwidth limitation of the OTA transconductance.

In accordance with a further embodiment, a method of compensating for a bandwidth limitation of an active frequency-selective circuit comprises determining both the cut-off frequency of the active device and the value of an effective negative resistance that results, at least in part, from the cut-off frequency. A compensation resistor is provided that, at a predetermined operating frequency, is effective to compensate for the negative resistance.

In accordance with a still further embodiment, a Gm-C filter circuit comprises a first compensated reactive branch coupled between an input node and an intermediate node and comprises a second compensated reactive branch coupled between the intermediate node and an output node.

In addition, in another embodiment, a system, such as a receiver system, comprises a bandwidth-compensated filter. The filter includes an active device having a reactive component coupled to an output port. A compensation resistance is coupled to the reactive device to compensate for the finite bandwidth of the active device.

BRIEF DESCRIPTION OF THE DRAWINGS

The subject Gm-C filter compensation may be better understood by, and its many features, advantages and capabilities made apparent to, those skilled in the art with reference to the Drawings that are briefly described immediately below and attached hereto, in the several Figures of which identical reference numerals (if any) refer to identical or similar elements, and wherein.

Figure 1A:
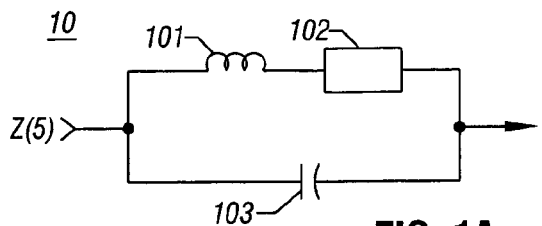
FIG. 1A is an equivalent circuit diagram of a frequency-selective circuit in which an inductance is realized through operation transconductance amplifier (OTA) techniques.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION

For an understanding of the subject OTA compensation technique for Gm-C filters, reference may be had to the following Detailed Description, including the appended Claims, in connection with the above-described Drawings.

Gm-C circuits, and, particularly, Gm-C filters, have found widespread application in the design of electronic circuitry, and the technical literature is rich with material directed to the design an operation of Gm-C filters. See, for example, P. Andreani and S. Matthisson, "A CMOS Gm-C IF Filter for Bluetooth, *Proc. Custom Integrated Circuit Conference* 2000, paper 18-6 (May 2000); Yamazaki, et al., "A 450 KHz CMOS Gm-C Bandpass Filter with ±0.5% Center Frequency Accuracy for On-Chip PDC IF Receivers, *IEEE International Solid-State Circuits Conference* (1999); B Nauta, "A CMOS Transconductance-C Filter Technique for Very High Frequencies," *IEEE Journal of Solid-State Circuits*, vol. SC-27, No. 2, pp. 142–153 (Febuary 1992).

Gm-C filters are especially conspicuous in communications equipment, for example, where they may be utilized in the realization of bandpass filters, VCOs (voltage controlled oscillators), loop filters for PLLs (phase-locked loops), and the like. Principal advantages of Gm-C filters derive from their easy compatibility with prevailing integrated circuit fabrication technology, and from the ability of Gm-C filters to be electronically (and therefore, rapidly) tuned. That is, the center frequency or cutoff frequency of a Gm-C filter may be adjusted electronically by the application of an appropriate control signal (e.g., tuning voltage or current). The control signal is conventionally applied to either a controllable transconductance or controllable capacitance in the Gm-C filter. As is well known, the transconductance of a Gm-C filter may be controlled by controlling a bias current that flows in an active device, such as a bipolar or MOS (metal oxide semiconductor) transistor. The capacitance of Gm-C filter may be controlled by applying an appropriate tuning voltage to a voltage-dependent capacitance (such as a varactor diode), or by selectively switching fixed, binary-weighted capacitors.

Generally, to the extent that a Gm-C filter is required to incorporate an inductor in order to achieve a desired frequency response, then the inductor may be realized by coupling a capacitance to the output port of a gyrator. The capacitance is then reflected as an equivalent inductance at the gyrator input port.

Figure 2A:
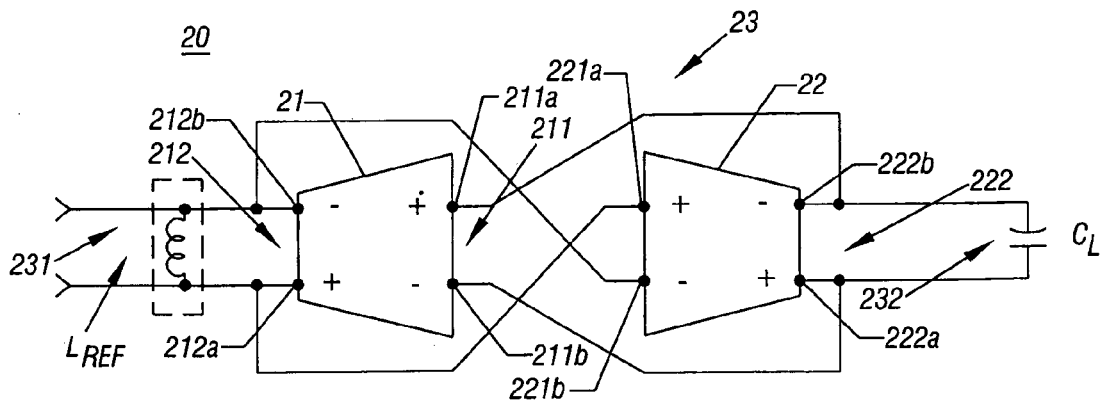
FIG. 2A is a circuit diagram in accordance with one embodiment, in which an inductor may be realized through cross-coupled biquad OTAs.

FIG. 1A depicts a straightforward example of a frequency-selective circuit 10 that may be included as, for example, a branch of a lumped-parameter, passive filter in an integrated circuit device. Frequency-selective circuit 10 is shown to comprise an inductance in the form of inductor 101 coupled in series with resistor 102. A capacitor 103 is coupled in parallel with the series combination of inductor 101 and resistor 102. As a practical matter, resistor 102 may represent the parasitic resistance associated with inductor 101, a discrete resistor coupled to inductor 101, or a combination thereof. As is well known, the center frequency of circuit 10 is proportional to $(LC)^{-1/2}$, where L represents the magnitude of the inductance of inductor 101 and C represents the magnitude of the capacitance of capacitor 103. The quality factor (Q) of circuit 10 is proportional to $(L/C)^{1/2}/R$, where R represents the magnitude of the resistance of resistor 102. Because, as suggested above, inductive devices are not always easily realizable in accordance with conventional integrated circuit fabrication technology, a necessary inductance in an integrated circuit device may be provided in a circuit such as circuit 10 by resort to a gyrator-based implementation. FIG. 2A depicts a more or less conventional approach to an OTA implementation of a gyrator-synthesized inductor.

Referring now to FIG. 2A, an inductor, $L_{REF}$, is synthesized in a Gm-C filter circuit 20 that includes a pair of cross-coupled OTAs 21 and 22, respectively. A first OTA 21 comprises differential input 211 comprising a noninverting (+) input 211a and an inverting (−) input 211b. OTA 21 further comprises a differential output 212 comprising a noninverting (+) output 212a and an inverting output 212b. A second OTA 22 comprises a differential input 221 comprising a noninverting (+) input 221a and an inverting (−) input 221b. OTA 22 further comprises a differential output 222 comprising a noninverting (+) output 222a and an inverting (−) output 222b. OTA 21 and OTA 22 are cross-coupled in that (+) input 211a is coupled to (−) output 222b; (−) input 211b is coupled to (+) output 222a of OTA 22; (+) input 221a of OTA 22 is coupled to (+) output 212a of OTA 21; and (−) input 221b of OTA 22 is coupled to (−) output 212b of OTA 21. Adopting the convention that outputs 212a and 212b of OTA 21 constitute the input port, and that outputs 222a and 222b of OTA 22 constitute the output port, of a gyrator 23 that comprises OTA 21 and OTA 22, then the capacitor, $C_L$, coupled across the output port of 232 of gyrator 23 is reflected as an equivalent inductor, $L_{REF}$, at input port 231 of gyrator 23. (Skilled practitioners are aware that the specific interconnection of OTA 21 and OTA 22 illustrated in FIG. 2A is merely exemplary. The inputs and outputs of OTA 21 and OTA 22 may be otherwise interconnected so as to form a gyrator that is equivalent, for purposes of this invention, to gyrator 23.) For an ideal gyrator comprising OTAs having a transconductance Gm, then the magnitude of the inductor, $L_{REF}$ is given by:

$$L_{REF} = \frac{C_L}{G^2 m}. \quad \text{(Eq. 1)}$$

Generally, however, a gyrator fabricated in accordance with conventional integrated circuit fabrication techniques will exhibit a transconductance that is a function of frequency. This results from the finite bandwidth of realizable OTAs. Specifically, the transconductance of gyrator 23, as a function of frequency, may be expressed as:

$$Gm(s) = \frac{Gm(0)}{1 + \frac{s}{w_a}}, \quad \text{(Eq. 2)}$$

In Eq. 2, s=jw; Gm (0) is the low-frequency transconductance of the gyrator; and $w_a$ is the 3-db cut-off frequency of Gm(s).

Stated alternatively:

$$Gm(s) = \frac{Gm(0)}{1 + j\tan(\text{phase shift})_w}. \quad \text{(Eq. 3)}$$

If tan (phase shift)$_w$ is defined as $\Delta$, then:

$$\begin{aligned} L(s) &= \frac{C(1 + s/w_a)^2}{G_m(0)^2} \\ &= \frac{C(1 + j\Delta)^2}{G_m(0)^2} \\ &= L(0)(1 + j\Delta)^2 \\ &= L(0) + 2jL(0)\Delta - L(0)\Delta^2. \end{aligned} \quad \text{(Eq. 4)}$$

The reflected impedance at the input port 231 of the gyrator 23 becomes $$Z(s) = \frac{L(s) + R}{s^2 L(s)C + sCR + 1}. \quad \text{(Eq. 5)}$$

It can be easily demonstrated that the denominator of Eq. 5 may be rewritten in the form:

$$1 + C(R - 2L(0)w\Delta)s + L(0)(1 - \Delta^2)Cs \quad \text{(Eq. 6)}$$

Figure 1B:
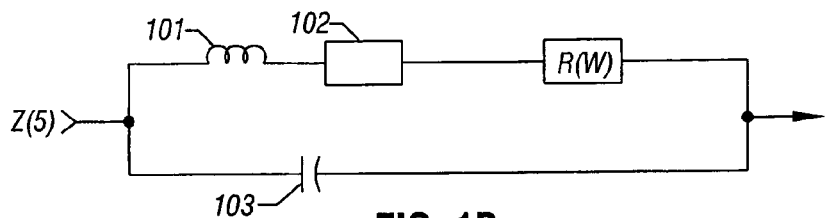
FIG. 1B is an equivalent circuit diagram of the frequency-selective circuit of FIG. 1A, including, however, an effective compensation resistor to mitigate the frequency-dependent effects of the finite OTA bandwidth.

It may be determined by inspection of Eq. 6 that the effect of the bandwidth limitations of the OTA transconductance (i.e., $\omega_a \neq \infty$) is, equivalently, to give rise to an additional resistance in series with resistor 102. See FIG. 1B. The equivalent resistor, designated –R(w) in FIG. 1B, has a value equal to:

$$-2L(0)\Delta w, \text{ where } w=-js \quad \text{(Eq. 7)}$$

Stated alternately, because of the finite OTA bandwidth, an additional (negative) resistance appears in series with reflected inductance. The magnitude of this resistance, given by Eq. 7, increases with frequency. In general, the negative resistance causes the Q of the filter to become larger, which gives rise to significant undesirable anomalies in the transfer function of the Gm-C filter. In particular, in a manner that is demonstrated below, the frequency-dependent negative resistance causes peaks, or ripples, in the filter passband.

Another result of the gyrator, i.e., OTA, bandwidth limitations is that the magnitude of the inductance of L1 also becomes frequency dependent in a manner that conforms to the relationship:

$$L = L(0)(1 - \Delta^2). \quad \text{(Eq. 8)}$$

However, under prevailing operating conditions, $\Delta^2$ may be confidently expected to be less than 0.01. For example, when the operating frequency of the Gm-C filter is at least a decade below the OTA 3 db bandwidth, then $\Delta^2$ will be less than 0.01. Consequently, the effect on the magnitude of the inductance is of only secondary significance.

Figure 3A:
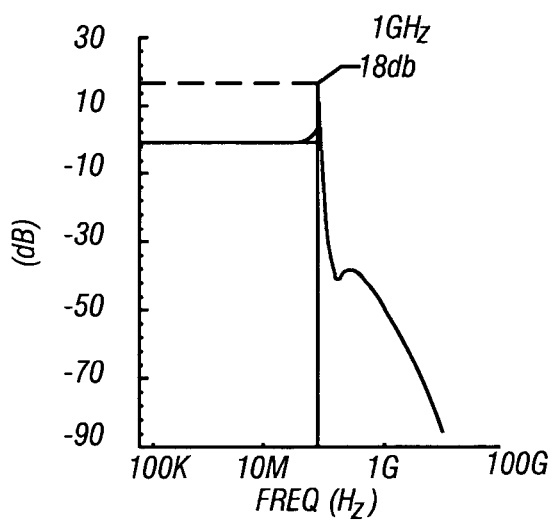
FIGS. 3A–3D are graphical depictions of the frequency response characteristics produced by simulated Gm-C filters that comprise OTAs having various bandwidths.
Figure 3B:
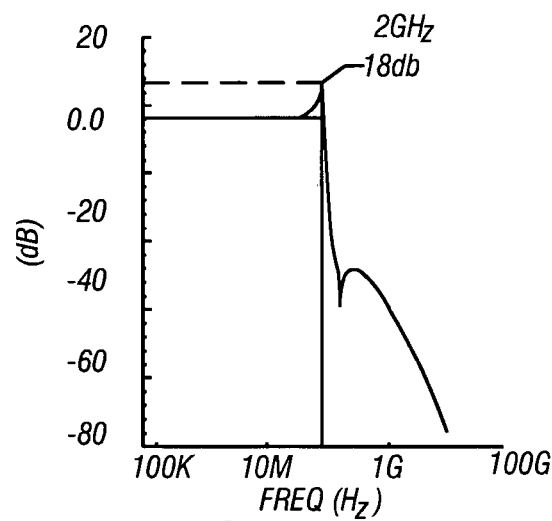
Figure 3C:
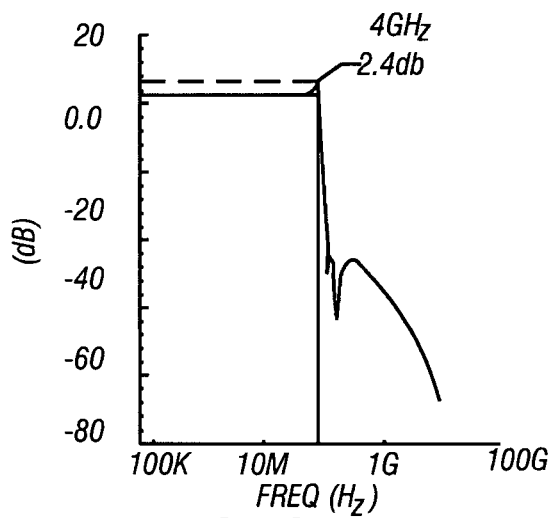
Figure 3D:
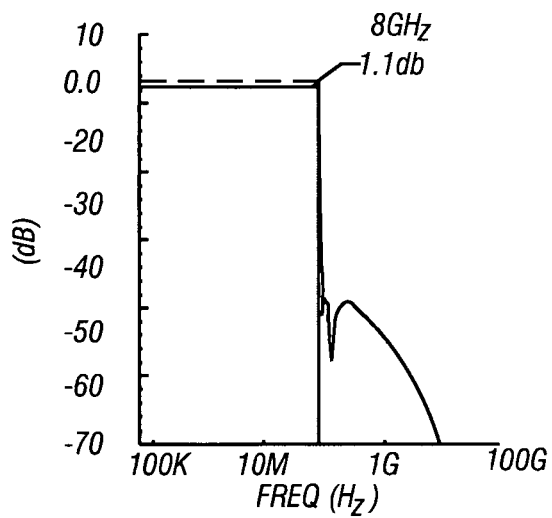

FIGS. 3A–3D present simulation results that demonstrate the respective effects on a filter transfer function as a result of the following representative OTA bandwidths: 1 GHz (FIG. 3A), 2 GHz (FIG. 3B), 4 GHz (FIG. 3C), and 8 GHz (FIG. 3D). The filter represented in FIGS. 3A–3D is a $5^{th}$-order elliptic filter designed to have a 83 MHz passband and 0.1 db ripple. The simulation results indicate that limitations in the OTA bandwidth are attended by the following significant deleterious effects:

(1) The passband exhibits a peak that increases as the OTA bandwidth decreases;

(2) Stopband attenuation become degraded as the OTA bandwidth decreases; and (3) The stopband corner frequency deviates somewhat from the ideal as the OTA bandwidth decreases.

Perhaps the most significant insight to be drawn from FIGS. 3A–3D is the degree to which passband peaks in the frequency response correlate to OTA bandwidth. Note that the simulation suggests that when considering, for example, the design of a $5^{th}$-order bandpass elliptic filter with a nominal cutoff frequency of 83 MHz, then an OTA with a bandwidth limited to 1 GHz, and a maximum Q (quality factor) equal to approximately 5, produces a peak in the passband of approximately 18 db. Corresponding results for bandwidths of 2 GHz, 4 GHz and 8 GHz are approximately: 6.4 db, 2.4 db, and 1.1 db, respectively. Note as well that at OTA bandwidths below 4 GHz, the maximum stopband attenuation is substantially degraded.

As indicated above, there exist a number of the known approaches to mitigate the undesirable effects associated with finite OTA bandwidth. Heretofore, none of those approaches have proven entirely satisfactory. To wit: attempts at extending the OTA bandwidth may be daunting. For example, with respect to conventional CMOS processes, extension of the OTA bandwidth beyond, approximately, 2 or 3 GHz is generally impracticable. Furthermore, an OTA design that achieves this bandwidth may be attended by other undesirable effects (e.g., instability, excessive power consumption, and consumption of additional semiconductor area). A second candidate approach involves the insertion of a zero in the frequency response of the OTA circuit in an effort to cancel the phase shift associated with finite OTA bandwidth. The efficacy of this approach is diminished by mismatch conditions that inevitably arise between integrated lumped passive elements (e.g., capacitors and resistors) in the OTA circuit.

However, in accordance with one embodiment of the invention, OTA bandwidth limitations may be remediated in a more nearly optimal manner through the addition of a resistor that compensates for the effective negative resistance that results from the OTA bandwidth limitation. In one embodiment, the compensating resistor should have a value that compensates for a negative resistance. The magnitude of the negative resistance is approximately equal to 2L (0) $\Delta w$.

See Eq. 7. In addition, from Eq. 7 it may be inferred that an ideal implementation of the compensation resistor will result in a value of resistance that varies with frequency. However, realization of such a frequency-dependent resistor is itself impracticable. Nevertheless, in one embodiment, effective compensation may be achieved by selecting the resistor to have a desired value at a particular operating frequency, $w_c$, where $w_c$ may be referred to as the frequency of the compensation, or compensation frequency. In one embodiment, $w_c$ may be determined, either empirically or analytically, as the frequency at which maximum Q of the filter in question occurs.

In addition, because the Gm-C filter implementations of concern here exhibit only a virtual inductor, $L_{REF}$, there exists no inductor that is accessible to be connected (physically) in series with the compensation resistor. Therefore, in one embodiment, the compensation resistor may be coupled across, i.e., in parallel with, $C_L$.

Given the circuit configuration of FIG. 2A, it may be routinely demonstrated that in order to reflect, in series with $L_{REF}$, a resistance having the value $2L(0)\Delta w_c$, then a compensating resistor, $R_{comp}$, must be coupled in parallel with $C_L$. The value of the compensating resistor is given by:

$$R_{comp} = \frac{1}{2C_L w_c \Delta_c}. \quad \text{(Eq. 9)}$$

Figure 2B:
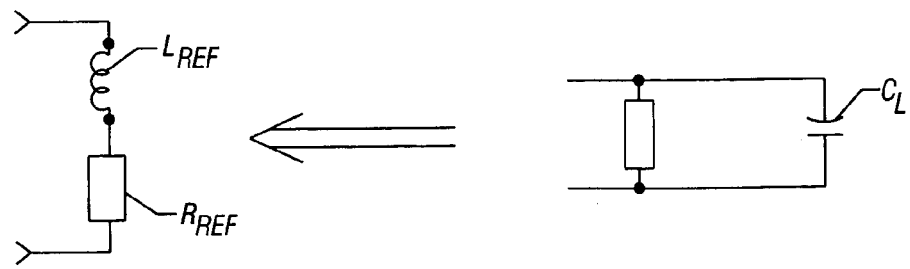
FIG. 2B is a circuit diagram showing a compensating resistance in accordance with an embodiment of the present invention.

From Eq. 9 it may be seen that the value of the compensation resistor is inversely proportional to $C_L$ and is also inversely proportional to $\Delta$, where $\Delta$ is defined as the tangent of the phase-shift at the frequency of compensation. Stated alternatively, compensation is imparted to the bandwidth-limited filter at a predetermined compensation frequency, i.e., the frequency at which the maximum Q ($Q_{max}$) of the filter occurs. $R_{comp}$ is inversely proportional to $\Delta$, where $\Delta$ is understood to be the phase-shift in the frequency-dependent transconductance of the gyrator OTAs, at the frequency of compensation. FIG. 2B depicts an embodiment wherein a compensating resistor, $R_{comp}$, of predetermined resistance value is coupled in parallel with $C_L$.

The technique described above is equally applicable to more elaborate Gm-C filter circuits. Consider, here, further analysis of an elliptic 83 MHz bandpass filter that is designed to have 0.1 db passband ripple and 39.5 db stopband attenuation. Such a filter may be assumed here to be characterized by a theoretical $Q_{max}=5.063$ and a $Q_{min}=1.09$, corresponding, respectively, to $w_{max}=5.532\times10^8$ and $w_{min}=4.489\times10^8$.

Suppose, further that $\Delta=\frac{1}{40}$ at $W_{max}$.

$$Q = -\frac{1}{2\Delta} = -20.$$

Then the realized $Q_{max}$ and $Q_{min}$ (caused by the OTA limited bandwidth) are:

$$Q'_{max} = \frac{(5.063)(-20)}{(5.063-20)} = 6.78, \text{ and}$$

$$Q'_{min} = \frac{(1.09)(-20)}{(1.09-20)} = 1.15.$$

Accordingly, there is experienced in $Q_{max}$ a deviation of approximately 34% and a deviation in $Q_{min}$ of approximately 6%.

Effective compensation for a multi-Q Gm-C filter may be achieved in one embodiment with benefit of the following critical insights: $Q_{max}$ experiences to a much greater degree the negative effects of OTA bandwidth limitations. Furthermore, $Q_{min}$ occurs a lower frequency that is very close to the frequency of $Q_{max}$. Consequently, if the compensating resistor is selected to compensate at a frequency corresponding to $Q_{max}$, then $Q_{min}$ will be largely compensated as well. Accordingly, in accordance with one embodiment of the invention, with respect to a Gm-C filter that exhibits both a $Q_{max}$ and $Q_{min}$, compensation of the Gm-C filter is effected by imparting compensation at the frequency at which $Q_{max}$ occurs.

Figure 4A:
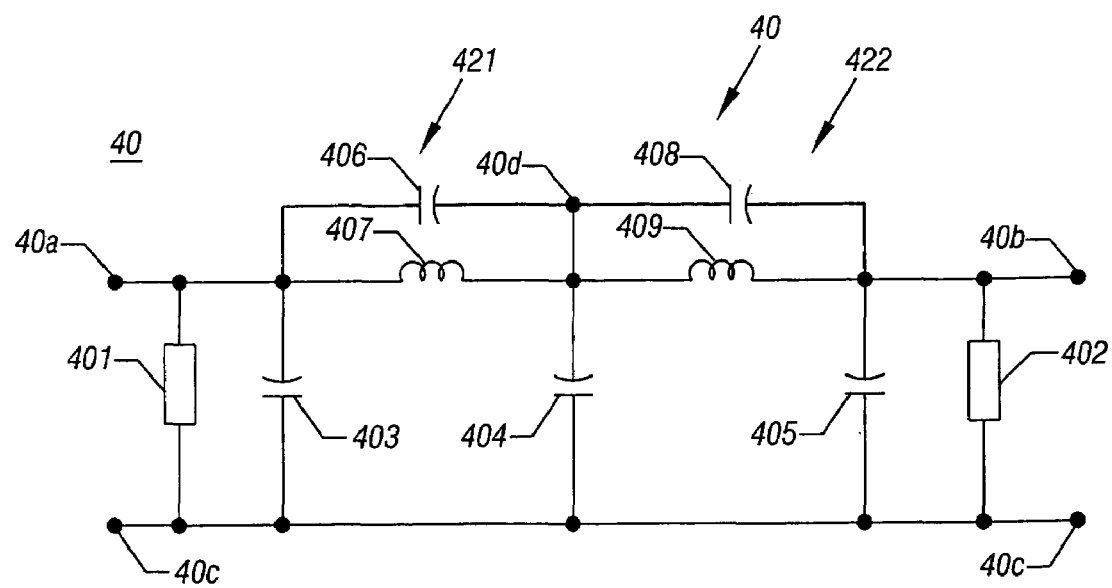
FIGS. 4A and 4B are schematic diagrams of an elliptic filter configured in accordance with an embodiment of the invention.

FIGS. 4A–4D illustrate the construction of hypothetical filter that incorporates an embodiment of invention. Specifically, FIG. 4A depicts a hypothetical elliptical low-pass filter 40 that is designed to have a cutoff frequency of 83 MHz, 0.1 db bandpass ripple, and 39.5 db stopband attenuation. As may be seen in FIG. 4A, filter 40 comprises an input node 40a, an output node 40b, a return node 40c, and an internal node 40d. In some embodiments, return node 40c may be a physical or virtual ground (GND). A first resistor 401 is coupled between nodes 40a and 40c, and a second resistor 402 is coupled between nodes 40b and 40c. Resistors 401 and 402 may perform an impedance-matching function. Capacitors 403, 404 and 405 are coupled between respectively, at one end to nodes 40a, 40d, and 40b, and at a respective second end to node 40c. A first parallel inductive/capacitive branch, comprising the parallel connection of a capacitor 406 and the inductor 407, is coupled between nodes 40a and 40d. A second parallel inductive/capacitive branch, comprising the parallel connection of a capacitor 408 and an inductor 409, is coupled between nodes 40d and 40b. A capacitor 405 is coupled between nodes 40d and 40c. In the manner described above, inductors 407 and 409 may, in one embodiment, be implemented in the dual-OTA, gyrator realization of FIG. 2.

Figure 4B:
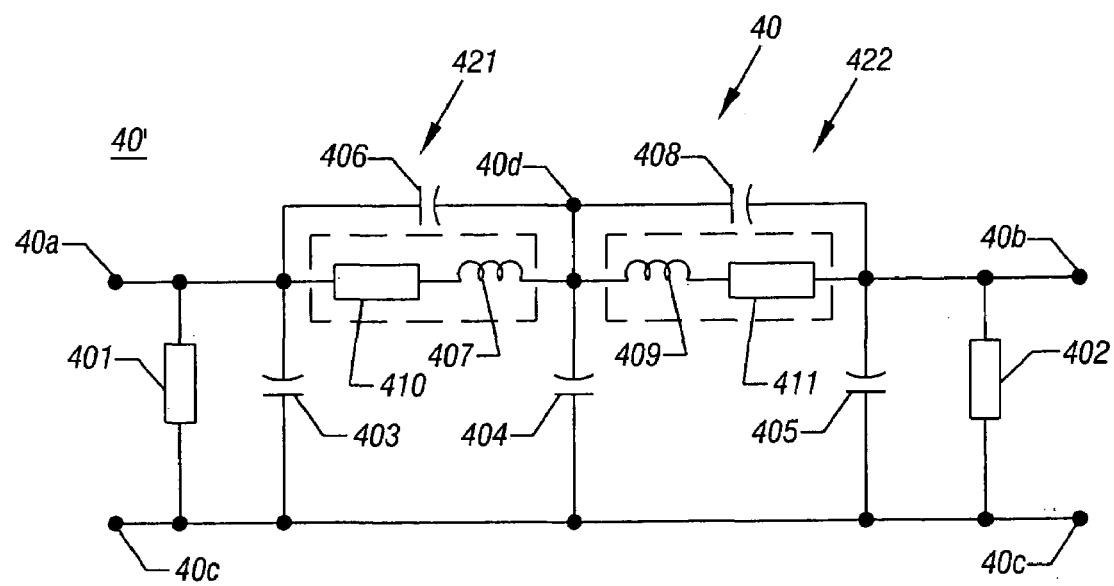

Specifically, in some embodiments, a Gm-C implementation of elliptic filter 40 may be predicated on OTA implementation of inductors 407 and 409. That is, inductors 407 and 409 are not physical devices but, rather, are reflected inductances that correspond to respective discrete capacitances that are coupled to the output ports of OTA gyrators. In this sense, then, inductors 407 and 409 may be deemed virtual inductors. In one embodiment, inductors 407 and 409 are realized through resort to a gyrator circuit such as set forth in FIG. 2A. (For purposes of simplicity, the complete gyrator structure is not replicated in FIG. 4A.) However, m accordance with a conventional implementation, associated with each of inductors 407 and 409 is a frequency-dependent negative resistance (not illustrated in FIG. 4A) that results from bandwidth limitations inherent in the gyrator OTAs. In accordance with an embodiment of the invention, the effects of the frequency-dependent negative resistance may be countervailed by including a resistor in parallel with the capacitance ($C_L$) that is coupled to the output ports of the gyrators. FIG. 4B depicts the effective equivalent circuit of an elliptic filter which inductors (such as inductor 407 and inductor 409) are realized by an OTA circuit that includes resistive compensation for bandwidth limitations.

FIG. 4B is a circuit diagram of the filter 40', with resistor compensation in accordance with one embodiment of the present invention. Filter circuit 40' is seen in FIG. 4B to additionally comprise a first compensating resistor 410 connection in series with inductor 407, and a second compensating resistor 411, connected in series with inductor 409. Recall here inductor 407 and inductor 409, illustrated in FIGS. 4A and 4B, are not physical inductances. Rather these inductors represent the respective inductances reflected to the input port of the gyrator, for example, as a result of a respective load capacitance, $C_L$, coupled to the output port. Similarly, resistor 410 and resistor 411 represent the respective resistances reflected to the input port as a result of compensating resistors coupled across a load capacitance $C_L$, in the manner explicitly depicted in FIG. 2B.

Figure 4C:
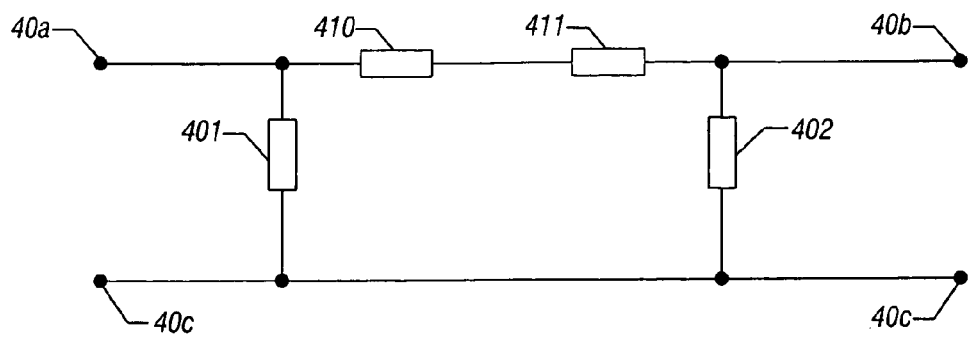
FIGS. 4C and 4D are, respectively, low-frequency and high-frequency equivalents of the compensated elliptic filter of FIG. 4B.
Figure 4D:
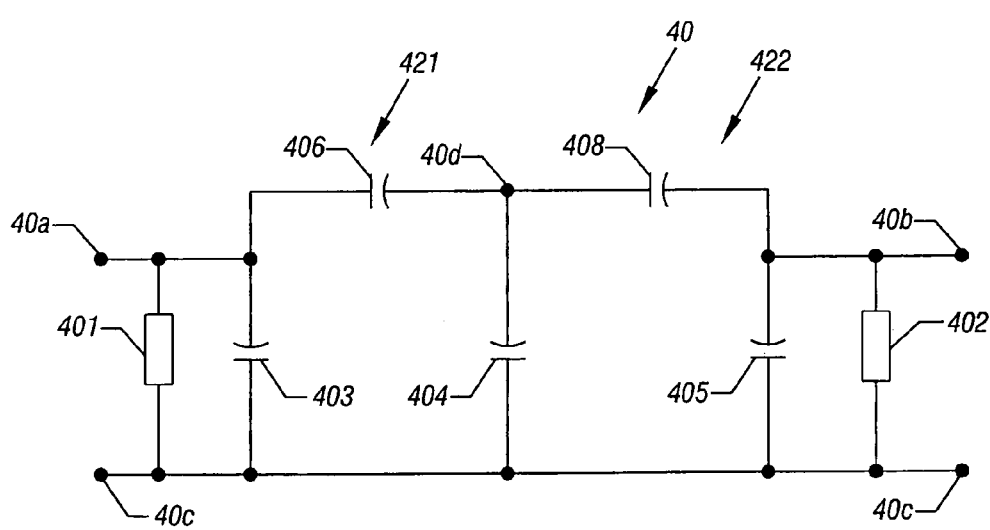

FIGS. 4C and 4D represent, respectively, the DC equivalent and the high-frequency equivalent of the compensated filter illustrated in FIG. 4B. That is, at DC all capacitors become open circuited (infinite impedance) and all inductors become short-circuited (zero impedance). At high frequencies (FIG. 4D), all inductances become open-circuited. Inspection and/or analysis of the filter circuit illustrated in FIGS. 4A–4D yield the following conclusions. The gain of the compensated filter of FIG. 4B is smaller by a factor of 2Δ than the gain of the uncompensated filter of FIG. 4A. The stopband attenuation of the compensated filter is similarly 2Δ worse than that of the uncompensated filter. Accordingly, if Δ is small, these effects are negligible. In addition, any diminution in the gain of the compensated filter may be easily recovered by increasing the gain of a preceding stage to corresponding degree.

Figure 5:
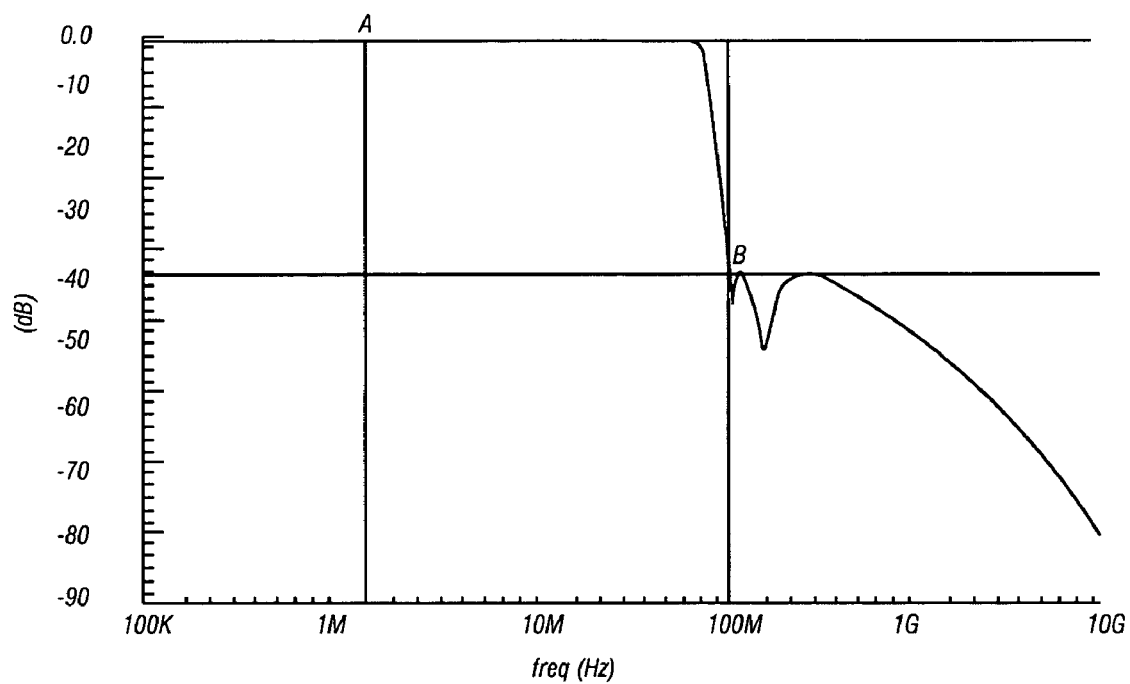
FIG. 5 is a graphical depiction of a frequency response produced by a simulated Gm-C elliptic filter in accordance with an embodiment of the invention.

FIG. 5 is the simulated frequency response of filter 40', the compensated filter, assuming an operative OTA bandwidth of 2 GHz. Perhaps most significantly, the simulated compensated filter exhibits less than 0.2 db bandpass ripple. With reference back to FIGS. 3A–3D, one may reasonably conclude that in order to achieve such a low level of passband ripple, an OTA bandwidth of 8 GHz may otherwise be required. In addition, the simulation indicates only approximately 0.8 db degradation in both passband attenuation and stopband rejection, when compared to an uncompensated filter.

Figure 6:
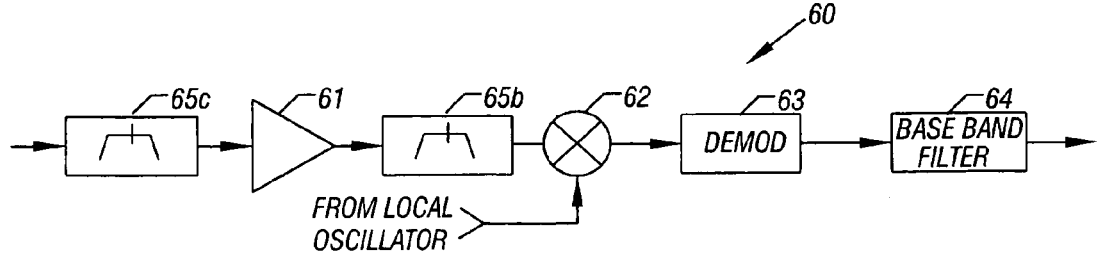
FIG. 6 is a block diagram of a receiver system that incorporates a bandwidth-compensated filter in accordance with an embodiment of the invention.

The subject Gm-C tuning technique is attractive in numerous applications. For example, the apparatus may be used with salutary effect in a receiving system such as depicted in FIG. 6. The receiving system of FIG. 6 is representative in its salient aspects of receiving systems that may be used in connection with DBS (direct broadcast satellite) communications equipment and may be included in the familiar set-top box for satellite television systems.

As illustrated in FIG. 6, receiving system 60 comprises a low-noise amplifier (LNA) 61 that serves as front end of the receiver. LNA 61 is, in operation, coupled to an appropriate antenna (not shown). The output of LNA 61 is frequency converted in a mixer 62. The frequency-converted output of mixer 62 is demodulated by demodulator 63. In many receiver system architectures, an IF (intermediate frequency) amplifier is interposed between mixer 62 and demodulator 63. The demodulated signal is coupled to a baseband filter 64, i.e., a low-pass filter with specified a cutoff frequency.

In alternative embodiments, receiving system 60 may also comprise a bandwidth-compensated filter 65 that may be interposed at one or more points in the reciever signal chain.

For example, filter 65a may appear at the input of LNA 61 so as to limit the spectral content of the signal at the input of LNA 61. Alternatively, or additionally, filter 65b may be coupled to the output of LNA 61 so as to limit the bandwidth of the signals that appear at the input of mixer 62.

Accordingly, from the Description above it is clear that there has been provided an effective countermeasure to the bandwidth limitations of OTAs that are used in, for example, active filters, including Gm-C filters. In one embodiment, resistive compensation obviates the need to extend OTA bandwidth in order to address anomalies in the Gm-C filter transfer function. Compensation may be effected by determining a compensation frequency, that is, the frequency at which the $Q_{max}$ of the filter in question appears. The value of the compensation resistance is inversely proportional to the tangent of the phase-shift in the frequency-dependent transconductance, at the compensation frequency.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A frequency-selective circuit comprising:
   an active device providing an input port and an output port, the active device having a bandwidth defined by a cutoff frequency, wherein the active device comprises an operational transconductance amplifier (OTA);
   a reactive component coupled to the output port; and
   a compensation resistance coupled to the reactive component, wherein the compensation resistance is effective to compensate for a bandwidth limitation of the active device, the compensation resistance having a resistance value that is inversely proportional to a reactance value of the reactive component, wherein the compensation resistance comprises a compensation resistor and wherein the compensation resistor has a resistance value that is inversely proportional to a tangent of a phase-shift at a predetermined compensation frequency.

2. The frequency-selective circuit defined in claim 1, wherein the predetermined compensation frequency is a frequency at which a $Q_{max}$ of the frequency-selective circuit appears.

3. The frequency-selective circuit defined in claim 1, wherein the reactive component comprises a capacitor.

4. The frequency-selective circuit defined in claim 3, wherein the compensation resistor has a resistance value that is inversely proportional to a capacitance value of the capacitor.

5. The frequency-selective circuit defined in claim 3, wherein the compensation resistance comprises a resistor and, at a predetermined compensation frequency, the resistor has a resistance value that is proportional to a tangent of a phase-shift of the OTA transconductance at the predetermined compensation frequency.

6. A frequency-selective circuit comprising:
   an operational transconductance amplifier (OTA) having a bandwidth-limited transconductance that is defined by a cutoff frequency;
   a capacitor coupled to an output of the OTA so as to reflect an inductor at an input of the OTA; and
   a compensation resistor coupled to the capacitor and effective to compensate for a bandwidth limitation of the transconductance.

7. The frequency-selective circuit defined in claim 6, wherein, at a predetermined compensation frequency, the compensation resistor has a resistance value that is inversely proportional to a tangent of a phase-shift at the predetermined compensation frequency and inversely proportional to a capacitance value of the capacitor.

8. The frequency-selective circuit defined in claim 7, wherein the frequency-selective circuit exhibits a $Q_{max}$ and a $Q_{min}$, and wherein the predetermined compensation frequency is selected to correspond to $Q_{max}$.

9. The frequency-selective circuit defined in claim 6, further comprising a second OTA coupled to the OTA, and a second capacitor coupled to an output of the second OTA so as to reflect an inductor at an input of the second OTA.

10. The frequency-selective circuit defined in claim 9, further comprising a second compensation resistor coupled to the second capacitor to compensate for a negative reflected resistance of the second OTA.

11. A method of compensating for a bandwidth limitation of an active frequency-selective circuit, the method comprising:
    determining a compensation frequency at which a $Q_{max}$ of the active frequency-selective circuit occurs;
    determining a value of an effective negative resistance that results, at least in part, from a bandwidth limitation of an active device in the active frequency-selective circuit; and
    providing in the active frequency-selective circuit a compensation resistor that, at the compensation frequency, is effective to compensate the negative resistance.

12. The method defined in claim 11, wherein the active frequency-selective circuit comprises:
    the active device providing an input port and an output port, the active device having a bandwidth defined by a cutoff frequency; and
    a reactive device coupled to the output port.

13. The method defined in claim 12, further comprising: coupling the compensation resistor to the reactive device.

14. The method defined in claim 13, wherein the compensation resistor is selected to have a resistance value, at the compensation frequency, that is inversely proportional to the tangent of a phase-shift at the compensation frequency.

15. The method defined in claim 12, wherein the active device comprises an operational transconductance amplifier (OTA) having a transconductance that is bandwidth limited to a frequency approximate to the cutoff frequency.

16. The method defined in claim 15, further comprising: coupling the compensation resistor to the reactive device.

17. A method as defined in claim 16, wherein the compensation resistor is selected to have a resistance value, at the compensation frequency, that is inversely proportional to a phase-shift at the compensation frequency.

18. The method defined in claim 17, wherein the active frequency-selective circuit exhibits a $Q_{max}$ and a $Q_{min}$, the method further comprising:
    effecting compensation of the negative resistance at a frequency corresponding to $Q_{max}$.

19. A Gm-C filter circuit comprising:
    an input node;
    an output node;
    an intermediate node;
    a return node;
    a first compensated reactive branch coupled between the input node and the intermediate node; and
    a second compensated reactive branch coupled between the output node and the intermediate node.

20. The Gm-C filter defined in claim 19, wherein the first compensated reactive branch comprises:
    a first operational transconductance amplifier (OTA) device, the first OTA device having an input port and having a bandwidth defined by a first cutoff frequency;
    a first reactive device coupled to an output port of the first OTA device; and
    a first compensation resistance coupled to the first reactive device; and wherein the second compensated reactive branch comprises:
    a second OTA device, the second OTA device having an input port and having a bandwidth defined by a second cutoff frequency;
    a second reactive device coupled to an output port of the second OTA device; and
    a second compensation resistance coupled to the second reactive device.

21. The Gm-C filter defined in claim 20, wherein the first cutoff frequency is substantially equal to the second cutoff frequency.

22. The Gm-C filter defined in claim 20, wherein the first compensation resistance is effective to compensate for a bandwidth limitation of the first OTA device and the second compensation resistance is effective to compensate for a bandwidth limitation of the second OTA device.

23. The Gm-C filter defined in claim 20, wherein the first reactive device comprises a first capacitor and the second reactive device comprises a second capacitor.

24. The Gm-C filter defined in claim 23, wherein the first compensation resistance comprises a first compensation resistor having a first resistance value that is inversely proportional to the tangent of a phase-shift at a first compensation frequency and wherein the second compensation resistance comprises a second compensation resistor having a second resistance value that is inversely proportional to the tangent of a phase-shift at a second compensation frequency.

25. The Gm-C filter defined in claim 24, wherein, at the compensation frequency, the first resistance value is inversely proportional to a capacitance value of the first capacitor and the second resistance value is inversely proportional to a capacitance value of the second capacitor.

26. The Gm-C filter defined in claim 25, wherein the first OTA device and the second OTA device each comprise:
    a first OTA having differential inputs and differential outputs: and
    a second OTA having differential inputs and differential outputs, and wherein the differential outputs of the first OTA are coupled to the differential inputs of the second OTA; and
    the differential outputs of the second OTA are coupled to the differential inputs of the first OTA.

27. The Gm-C filter defined in claim 24, wherein the Gm-C filter circuit exhibits at least a $Q_{max}$ and a $Q_{min}$ and wherein the first compensation frequency is selected to correspond to the $Q_{max}$.

28. A system comprising:
    a low-noise amplifier (LNA) to receive a modulated carrier signal;
    a mixer coupled to the LNA;
    a demodulator coupled to the mixer; and
    a bandwidth-compensated filter coupled to the LNA, the bandwidth-compensated filter comprising:
        an active device providing an input port and an output port, the active device having a bandwidth defined by a cutoff frequency;

a reactive component coupled to the output port; and a compensation resistance coupled to the reactive component, wherein the compensation resistance is effective to compensate for a bandwidth limitation of the active device, the reactive component comprising a capacitance and wherein the compensation resistance comprises a compensation resistor having a resistance value that is inversely proportional to a product of a capacitance value of the capacitance and a tangent of a phase-shift at a predetermined compensation frequency.

29. The system defined in claim 28, wherein the active device comprises an operational transconductance amplifier (OTA) having a bandwidth-limited transconductance that is defined by the cutoff frequency.

30. The system defined in claim 29, wherein the phase-shift is the phase-shift of the transconductance at the predetermined compensation frequency.

31. The system defined in claim 30, wherein the predetermined compensation frequency is the frequency at which a maximum Q of the bandwidth-compensated filter occurs.

* * * * *